United States Patent [19]

Furuya et al.

[11] 4,309,679
[45] Jan. 5, 1982

[54] SURFACE ACOUSTIC WAVE FILTER

[75] Inventors: Nobuaki Furuya; Yoshihiro Kino; Hiroshi Miyama, all of Kawasaki, Japan

[73] Assignee: Matsushita Electric Industrial Company, Limited, Osaka, Japan

[21] Appl. No.: 99,639

[22] Filed: Dec. 3, 1979

[30] Foreign Application Priority Data

Dec. 4, 1978 [JP] Japan ................................ 53-150218

[51] Int. Cl.³ .......................... H03H 9/64; H03H 9/72
[52] U.S. Cl. .................................... 333/195; 333/153; 333/194
[58] Field of Search ................... 333/150-155, 333/193-196; 331/107 A; 310/313 R, 313 A, 313 B, 313 C, 313 D

[56] References Cited

U.S. PATENT DOCUMENTS

| | | | |
|---|---|---|---|
| 3,743,973 | 7/1973 | Jones | 333/151 |
| 3,883,831 | 5/1975 | Williamson et al. | 333/153 |
| 3,972,011 | 7/1976 | Coussot et al. | 333/151 |
| 4,114,119 | 9/1978 | Sandy et al. | 333/196 X |
| 4,130,813 | 12/1978 | Sandy et al. | 333/195 X |

OTHER PUBLICATIONS

Sandy et al.-"Surface Acoustic Wave Ring Filter", 1976 Ultrasonics Symposium Proceedings, IEEE Cat. No. 76 CH1120-1125SU; pp. 391-396.

*Primary Examiner*—Marvin L. Nussbaum
*Attorney, Agent, or Firm*—Lowe, King, Price & Becker

[57] ABSTRACT

In a conventional surface acoustic wave ring filter, a time-compensation element in the form of a thin strip is additionally provided for either retarding or accelerating one of the surface acoustic waves which transmit along different transmission lines, thereby the phases of two surface acoustic waves received by a single output converter included in the filter are matched with each other resulting in the improvement in the output signal characteristics.

12 Claims, 5 Drawing Figures

SURFACE ACOUSTIC WAVE FILTER

FIELD OF THE INVENTION

This invention generally relates to a surface acoustic wave device, and more particularly, the present invention relates to a surface acoustic wave ring filter.

BACKGROUND OF THE INVENTION

In a conventional surface acoustic wave ring filter, an input electrical signal is initially converted into two surface acoustic waves by means of a first converter, and a plurality of reflectors are used for respectively transmitting the two surface acoustic waves along different transmission lines or paths. The two surface acoustic waves transmitted along different transmission lines are applied to an output second converter which converts the two surface acoustic waves into a single electrical signal. If the lengths of the transmission lines were exactly equal to each other, the waves would be added to each other vectorally by the second converter and thus the magnitude of the output electrical signal is substantially the same as that of the input electrical signal. However, it is very difficult to match the phases of the two surface acoustic waves with each other inasmuch as it is necessary to make the lengths of the transmission lines exactly equal to each other.

According to recent sophisticated photolithographic technique it is possible to achieve the precision as accurate as one micron in manufacturing microcircuits such as integrated circuits. However, as will be described hereinlater, the accuracy to this extent is still insufficient and therefore, a practical filter cannot be manufactured. The difference in the lengths of the transmission lines results in the production of frequency response ripple components in the output electrical signal, while the magnitude of the output electrical signal is undesirably attenuated.

SUMMARY OF THE INVENTION

This invention has been developed in order to remove the above mentioned drawbacks and disadvantages inherent to conventional surface acoustic wave filters.

It is, therefore, a primary object of the present invention to provide a surface acoustic wave filter and a method of passing a given frequency in which transmission loss is remarkably reduced.

Another object of the present invention is to provide a surface acoustic wave filter and a method of passing a given frequency in which ripple components are not generated.

A further object of the present invention is to provide a surface acoustic wave filter and a method of passing a given frequency in which the phases of surface acoustic waves received by an output converter thereof are matched with each other.

According to the present invention the phases of first and second surface acoustic waves, which respectively transmit along first and second transmission lines and reach an output converter, are matched with each other by either retarding or accelerating one of the surface acoustic waves by means of a strip placed in one of the transmission lines, which strip has a propagation velocity different from that of said substrate.

DETAILED DESCRIPTION OF THE PREFERRED EMBODIMENT

Prior to describing the embodiment of the present invention, a conventional surface acoustic wave ring filter will be discussed for a better understanding of the objects of the present invention.

Figure 1:
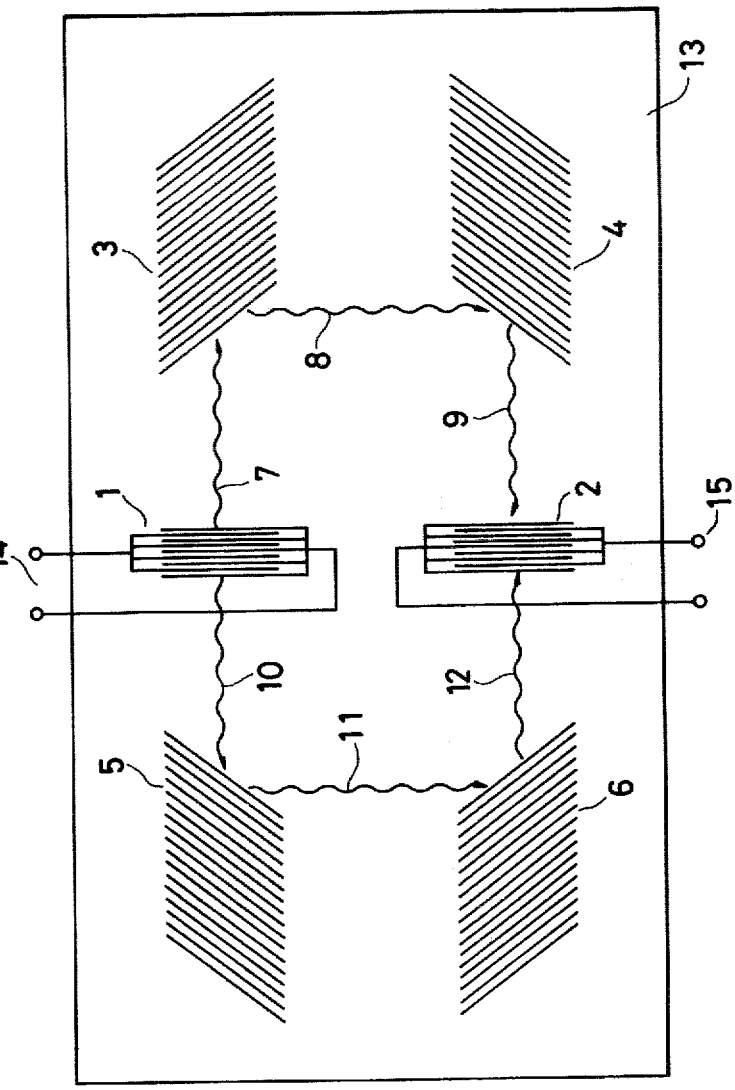
FIG. 1 illustrates a conventional surface acoustic wave ring filter.

FIG. 1 illustrates a schematic top-plan view of a conventional surface acoustic wave ring filter. The filter is of so called ring-type and comprises a substrate 13 made of an insulating material, such as a piezoelectric crystal. On the substrate 13 are first and second converters 1 and 2, and first to fourth reflectors 3, 4, 5 and 6. Each converter 1 and 2 comprises a pair of electrodes (no numeral) which are shaped in an interdigital grating pattern. The first converter 1 comprises a pair of input terminals 14 respectively connected to the electrodes thereof, while the second converter 2 also comprises a pair of output terminals 15 respectively connected to the electrodes thereof. Each reflectors 3 to 6 takes the form of a periodical array structure as shown, and are arranged on the substrate 13 to have predetermined angle with respect to each other. In detail, the first and third reflectors 3 and 5 are placed at each side of the first converter 1, while the second and forth reflectors 4 and 6 are arranged at each side of the second converter 2.

The conventional filter of FIG. 1 operates as follows: An input electrical signal applied across the input terminals 14 is converted into a pair of surface acoustic waves 7 and 10 by the input first converter 1. The pair of waves 7 and 10 respectively emitted from the both sides of the first converter 1 are respectively transmitted to the first and third reflectors 3 and 5 along the surface of the substrate 13 and thus are reflected at right angles toward the second and fourth reflectors 4 and 6. The waves respectively reflected at the first and third reflectors 3 and 5 are designated as 8 and 11, and then transmitted to the second and fourth reflectors 4 and 6 to be reflected at right angles again in the direction toward the output second converter 2. The waves respectively reflected at the second and fourth reflectors 4 and 6 are designated as 9 and 12. These surface acoustic waves 9 and 12 are transmitted to each side of the second converter 2 so that these waves are converted into a single output electrical signal which will be drawn from the output terminals 15.

The above described first to fourth reflectors 3 to 6 are constructed by forming a plurality of parallel grooves or a plurality of parallel metallic thin film strips on the surface of the substrate 13. The grooves or the metallic strips are arranged in a periodic manner and the frequency characteristic of the filter will be determined by the periodic array structure.

With the provision of this type filter, unnecessary waves are effectively suppressed or attenuated and since the surface acoustic waves produced by the first converter 1 of interdigital grating pattern are totally received by the second converter 2 of interdigital grating pattern, the filter does not suffer from directional loss and thus the insertion loss should be quite low in theory.

However, a problem arises in connection with such a conventional ring-type surface acoustic wave filter that it is difficult to accurately match the phases of the two surface acoustic waves received by the output second converter 2 of interdigital grating pattern with each other. As the result frequency response ripple components of high level occur in the transmission frequency band, while the amount of insertion loss cannot be neglected.

Figure 2:
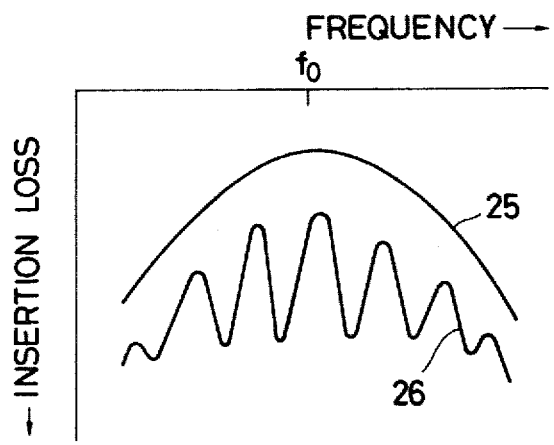
FIG. 2 illustrates the effects of phasing on filter characteristics.

Referring to FIG. 2 which shows frequency response characteristics with respect to frequency, the insertion losses are plotted along the vertical axis and the frequencies are plotted along the horizontal axis of the co-ordinate. A reference "$f_O$" indicates the center frequency of the filter. A first curve designated as 25 indicates a characteristic under the condition that the phases of the two surface acoustic waves are accurately matched with each other, while the other curve designated as 26 indicates a characteristic under the condition that there is a difference in phase. In case that a phase difference exists, undulations of short period occur in the characteristic curve resulting in the production of ripple components. Moreover, because of the presence of phase difference the insertion loss is great. These undesirable aspects of the conventional surface acoustic filter have been the obstacle in the practical use.

Figure 3A:
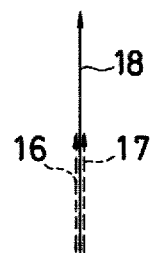
FIGS. 3A and 3B are vector diagrams showing the effects of phasing on insertion loss.
Figure 3B:
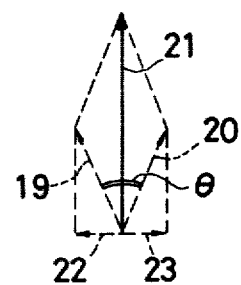

These aspects will be further discussed in connection with FIG. 3A and FIG. 3B which are vector charts. The first vector chart of FIG. 3A shows that two vectors 16 and 17 having no phase difference therebetween are added to each other to produce a composite single vector 18. The two vectors 16 and 17 respectively represent the amplitude and the phase of each of surface acoustic waves 9 and 12 illustrated in FIG. 1, and the vector 18 represents the resultant amplitude and phase of the output electrical signal developed across the output terminals 15. On the contrary, in case that there is a phase difference between the surface acoustic waves 9 and 12, the amplitude and the phases of the waves 9 and 12 are respectively represented by vectors 19 and 20 in FIG. 3B. It is assumed that the phase difference between the surface acoustic waves 9 and 12 is expressed in terms of "$\theta$". When the two vectors 19 and 20 are added to each other to produce a single vector 21, it will be noticed that the amplitude of the composite vector 21 is less than that of the vector 18 of FIG. 3A. This means that the output electrical power which can be derived from the output terminals 15 is lower than that obtained under no phase difference condition. In other words, the insertion loss becomes greater as the phase difference increases.

Meanwhile, residual surface acoustic waves respectively represented by vectors 22 and 23 are produced. These residual surface acoustic waves cannot be drawn from the second converter 2 of the interdigital grating pattern. The residual surface acoustic waves at both sides of the electrodes of the second converter 2 pass through the electrodes and respectively reach the first converter 1 via the transmission lines in the opposite direction. In other words, the residual surface acoustic wave at the left side of the second converter 2 passes through the electrodes of the second converter 2 and is transmitted to the second reflector 4 and then reflected at the second reflector 4 to be transmitted to the first reflector 3 so that the residual surface acoustic wave is again reflected at the first reflector 3 and is transmitted to the first converter 1. The other residual surface acoustic wave at the right side of the second converter 2 is transmitted to the first converter 1 in the similar manner through the third and fourth reflectors 5 and 6. The two residual surface acoustic waves respectively transmitted to the first converter 1 pass through the electrodes of the first converter 1 and thus respectively transmitted to the second converter 2 again via the original transmission lines. Namely, the two residual surface acoustic waves produced at the both sides of the second converter 2 respectively travel around through the four reflectors 3 to 6 and the first converter 1 to return to the second converter 2. The residual surface acoustic waves which have turned around interfere with the original surface acoustic waves resulting in the production of the afore-mentioned ripple components.

As will be understood from the above, it is necessary to avoid such phase difference. However, actually because of the unbalance in the arrangement of the four reflectors 3 to 6, the length along the first transmission line (which will be referred to as a clockwise route hereinafter), i.e. from the first converter 1 through the first reflector 3, and the second reflector 4 to the second converter 2, is different from that of the second transmission line (counterclockwise route), i.e. from the first converter 1 through the third reflector 5 and the fourth reflector 6 to the second converter 2.

Assuming that there is a difference $\Delta T$ in the propagation time between the above mentioned first and second transmission lines or routes, the phase difference "$\theta$" therebetween will be expressed as follows:

$$\theta = 360 \times f \times \Delta T \text{ (deg)} \ldots \quad (1)$$

wherein "f" is the center frequency of the surface acoustic waves;

"$\Delta T$" is the difference in time and is expressed by:

$$\Delta T = \Delta L / V \ldots \quad (2)$$

wherein "$\Delta L$" is the difference in length between transmission lines; and "V" is the velocity of the surface acoustic wave:

Let us assume that the difference in length $\Delta L$ is one micron. For instance, if the center frequency "f" of the surface acoustic wave is 500 MHz and the velocity "V" of the surface acoustic wave along the surface of the substrate 13 is 3,500 m/sec; we obtain the difference in phase "$\theta$" as much as 51 degrees from the above first and second equations (1) and (2).

From the foregoing, it will be apparent that the difference in length between the two lines or routes, which difference is as short as one micron, still causes the great difference in phase between the surface acoustic waves received by the output converter 2. As it is almost the limit in the recent sophisticated photolithographic technique in connection with the accuracy, it will be understood that considerable phase difference is apt to occur in the surface acoustic wave filter of this sort.

Figure 4:
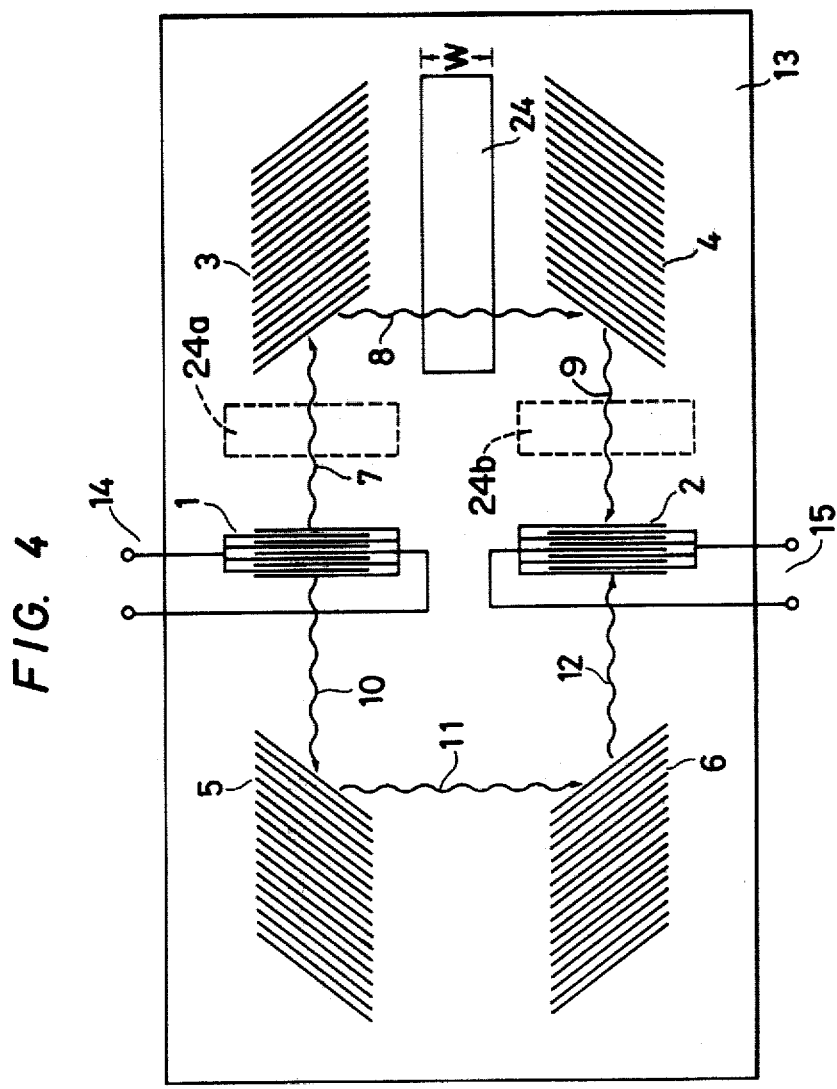
FIG. 4 is a top-plan view of a surface acoustic wave filter according to the present invention.

Turning to FIG. 4 a schematic top-plan view of an embodiment of the surface acoustic wave filter according to the present invention is illustrated. The construction of the filter shown in FIG. 4 is similar to that of a conventional filter of FIG. 1 except that a time-compensation element is additionally provided. Elements which reflectors 3 to 6 so that the entire surface acoustic wave is transmitted along the surface of the strip 24.

It is obvious for those skilled in the art that many modifications and variations are readily made without departing from the spirit of the present invention.

What is claimed is:

1. A surface acoustic wave filter comprising:
   (a) a substrate made of LiNbO$_3$;
   (b) a first converter comprising electrodes arranged in an interdigitated grating pattern for converting an electrical signal into a pair of surface acoustic waves which propagate along the surface of said substrate;
   (c) a pair of reflecting means respectively provided in the propagation lines of said pair of surface acoustic waves;
   (c) a second converter comprising electrodes arranged in an interdigitated grating pattern for converting a pair of surface acoustic waves respectively propagated from said pair of reflecting means via first and second transmission lines, into an electrical signal; wherein the improvement comprises:
   means for matching the phase of said pair of reflected surface acoustic waves received by said second converter, with each other, which adjusts the time of arrival of said pair of surface acoustic waves at said second converter, said phase matching means including a thin strip made of SiO$_2$ and, disposed on the surface of said substrate, said strip being placed in one of said first and second transmission lines, the propagation velocity of a surface acoustic wave along said strip being different from that along the surface of said substrate.

2. A surface acoustic wave filter comprising:
   (a) a substrate made of LiNbO$_3$;
   (b) a first converter comprising electrodes arranged in an interdigitated grating pattern for converting an electrical signal into a pair of surface acoustic waves which propagate along the surface of said substrate;
   (c) a pair of reflecting means respectively provided in the propagation lines of said pair of surface acoustic waves;
   (d) a second converter comprising electrodes arranged in an interdigitated grating pattern for converting a pair of surface acoustic waves respectively propagated from said pair of reflecting means via first and second transmission lines, into an electrical signal; wherein the improvement comprises;
   means for matching the phase of said pair of reflected surface acoustic waves received by said second converter, with each other, which adjusts the time of arrival of said pair of surface acoustic waves at said second converter, said phase matching means including a thin strip made of sapphire and, disposed on the surface of said substrate, said strip being placed in one of said first and second transmission lines, the propagation velocity of a surface acoustic wave along said strip being different from that along the surface of said substrate.

3. A surface acoustic wave filter as claimed in claim 1 or 2, wherein each of said reflecting means comprises a pair of reflectors having the shape of periodical array structure.

4. A surface acoustic wave filter as claimed in claim 3, wherein each of said reflectors comprises a plurality of parallel grooves made on the surface of said substrate.

5. A surface acoustic wave filter as claimed in claim 3, wherein each of said reflectors comprises a plurality of metallic thin strips arranged in parallel on the surface of said substrate.

6. A surface acoustic wave filter as claimed in claim 1 or 2, wherein the width of said strip in the direction of the propagation of said surface acoustic wave along the surface thereof is constant throughout the effective entire length of said strip.

7. A surface acoustic wave filter as claimed in claim 6, wherein said strip has a rectangular shape.

8. A surface acoustic wave filter as claimed in claim 1 or 2, wherein the effective length of said strip in the direction perpendicular to the direction of the propagation of said surface acoustic wave along the surface thereof is equal to or greater than the effective dimension of said reflectors.

9. A surface acoustic wave filter comprising:
   (a) a substrate;
   (b) a first converter comprising electrodes arranged in an interdigitated grating pattern for converting an electrical signal into a pair of surface acoustic waves which propagate along the surface of said substrate;
   (c) a pair of reflecting means respectively provided in the propagation lines of said pair of surface acoustic waves, each of said reflecting means comprising a pair of reflectors having the shape of a periodical array structure;
   (d) a second converter comprising electrodes arranged in an interdigitated grating pattern for converting a pair of surface acoustic waves respectively propagated from said pair of reflecting means via first and second transmission lines, into an electrical signal; wherein the improvement comprises:
   means for matching the phase of said pair of reflected surface acoustic waves received by said second converter, with each other, which adjusts the time of arrival of said pair of surface acoustic waves at said second converter, said phase matching means including a thin strip disposed on the surface of said substrate, the propagation velocity of a surface acoustic wave along said strip being different from that along the surface of said substrate, said strip being placed in one of said first and second transmission lines between said first converter and one of said reflectors.

10. A surface acoustic wave filter comprising:
    (a) a substrate;
    (b) a first converter comprising electrodes arranged in an interdigitated granting pattern for converting an electrical signal into a pair of surface acoustic waves which propagate along the surface of said substrate;
    (c) a pair of reflecting means respectively provided in the propagation lines of said pair of surface acoustic waves, each of said reflecting means comprising a pair of reflectors having the shape of a periodical array structure;
    (d) a second converter comprising electrodes arranged in an interdigitated grating pattern for converting a pair of surface acoustic waves respectively propagated from said pair of reflecting means via first and second transmission lines, into are also shown in FIG. 1 are designated by the like reference numerals, while the time-compensation element is designated as 24. It is obvious that the first and second converters 1 and 2, and the first to fourth reflectors 3 to 6 are schematically illustrated and, therefore the actual embodiment of the filter according to the present invention is not limited to the illustrated arrangement. The time-compensation element 24 is made of a thin strip having a propagation velocity different from that of the material used for the substrate 13. The time-compensation element 24 is inserted in the first transmission line and in this embodiment the time-compensation element 24 is placed between the first and second reflectors 3 and 4. The function of the time-compensation element 24 is to either delay or speed up the surface acoustic wave passing therethrough.

In order to match the phases of the surface acoustic waves received by the output second converter 2 one of, two methods can be adopted. Namely, it is possible to retard a surface acoustic wave which tends to reach the output converter 2 before the other surface acoustic wave or to speed up a surface acoustic wave which tends to reach the output converter 2 after the other surface wave. The amount of time either delayed or shortened will be determined by the material for the time-compensation element 24 and the width "W" thereof in the direction of the transmission of the surface acoustic wave therethrough.

It is now assumed that the length of the clockwise route (first transmission line) is shorter than that of the counterclockwise route (second transmission line), and therefore, the surface acoustic wave reaches via the clockwise route before the other surface acoustic wave reaches the same via the counterclockwise route if the above mentioned time-compensation element 24 is not provided. In this case a suitable thin metal strip deposited on the substrate 13 may be utilized as the time-compensation element 24. The width "W" of the time-compensation element 24 will be obtained by a simple calculation using the following formula:

$$W = \Delta T / \left( \frac{1}{V_m} - \frac{1}{V_o} \right) \quad (3)$$

wherein "Vm" is the velocity of the surface acoustic wave along the time-compensation element 24; and "Vo" is the velocity of the surface acoustic wave along the surface of the substrate 13.

It is assumed that the substrate 13 is made of a piezoelectric material, and the propagation velocity Vm along a metal deposited on the substrate 13 is always slower than that along a piezoelectric material. The material for the time-compensation element 24 is not limited to a metal or a conductive material. Namely, any kind of material having a propagation velocity lower than that of the substrate 13 may be used. In other words, the material for the time-compensation element has to be selected in view of the material for the substrate 13 since the velocity of the surface acoustic wave is of a relative factor. For instance, when the substrate 13 is made of LiNbO3 (lithium niobate), a time-compensation element made of SiO2 (silicon oxide) may be used in the form of a thin film strip. The time-compensation element made of silicon oxide elastically slows down the velocity of the surface acoustic wave relative to the velocity along the surface of the substrate made of lithium niobate. The width "W" of the thin film strip made of silicon oxide will be determined in view of the formula (3) in the same manner. The position of the time-compensation element 24 is not limited to such a place between the first and second reflectors 3 and 4. Namely, the time-compensation element 24 may be inserted somewhere in the first transmission line in this case, such as between reflector 3 and converter 1 (see strip 24a in dotted lines) or between reflector 4 and converter 2 (see strip 24b in dotted lines).

Although in the above described embodiment, the time-compensation element 24 is used to retard the surface acoustic wave by a predetermined interval, the other method, i.e. acceleration or speed up of a surface acoustic wave may be adopted instead as mentioned hereinbefore. In order to achieve this, a time-compensation element having a propagation velocity faster than that of the substrate 13 has to be placed in the transmission line through which the surface acoustic wave is likely transmitted to the output second converter 2 after the other surface acoustic wave arrives at the output converter 2. For instance, a thin film strip made of sapphire may be deposited as the time-compensation element 24 on the substrate 13 made of LiNbO3. If the surface acoustic wave via the counterclockwise route, i.e. the second transmission line, tends to reach the output second converter 2 after the other surface acoustic wave reaches the same via the clockwise route as assumed hereinabove, the time-compensation element having propagation velocity faster than that of the substrate 13 has to be inserted somewhere in the counterclockwise route.

The width "W" of the time-compensation element having propagation velocity faster than that of the substrate 13 may be derived from the following formula:

$$W = \Delta T / \left( \frac{1}{V_o} - \frac{1}{V_a} \right) \quad (4)$$

wherein "Vo" is the propagation velocity along the substrate 13; and "Vm" is the propagation velocity along the time-compensation element and it is obvious from the above that Va>Vo.

From the foregoing description, it will be understood that the time of arrival of the pair of surface acoustic waves at the second converter 2 is adjusted by means of the time-compensation element 24 so that the phases of the two surface acoustic waves received by the output second converter 5 are matched with each other.

In the described embodiment of FIG. 4, the number of the reflectors 3 to 6 is four, namely two for each route. However, the number of the reflectors is not limited to four. For instance, if the surface acoustic wave is reflected at 120 degrees at each reflector, three reflectors for each route is required to concentrate a pair of surface acoustic waves at a single output converter. Furthermore, although the shape of the time-compensation element 24 is shown to be rectangular, the shape thereof is not limited to such a rectangular shape. In other words, what is required in connection with the shape of the strip 24 is that the width "W" of the strip 24 in the direction of the propagation of the surface acoustic wave along the surface thereof should be constant or uniform throughout the entire length of the strip 24. As to the longitudinal length of the strip 24 it will be understood that the effective length should be equal to or greater than the effective dimension of the an electrical signal; wherein the improvement comprises:

means for matching the phase of said pair of reflected surface acoustic waves received by said second converter, with each other, which adjusts the time of arrival of said pair of surface acoustic waves at said second converter, said phase matching means including a thin strip disposed on the surface of said substrate, the propagation velocity of a surface acoustic wave along said strip being different from that along the surface of said substrate, said strip being placed in one of said first and second transmission lines between said pair of reflectors.

11. A surface acoustic wave filter comprising:
(a) a substrate;
(b) a first converter comprising electrodes arranged in an interdigitated grating pattern for converting an electrical signal into a pair of surface acoustic waves which propagate along the surface of said substrate;
(c) a pair of reflecting means respectively provided in the propagation lines of said pair of surface acoustic waves, each of said reflecting means comprising a pair of reflectors having the shape of a periodical array structure;
(d) a second converter comprising electrodes arranged in an interdigitated grating pattern for converting a pair of surface acoustic waves respectively propagated from said pair of reflecting means via first and second transmission lines, into an electrical signal; wherein the improvement comprises:

means for matching the phase of said pair of reflected surface acoustic waves received by said second converter, with each other, which adjusts the time of arrival of said pair of surface acoustic waves at said second converter, said phase matching means including a thin strip disposed on the surface of said substrate, the propagation velocity of a surface acoustic wave along said strip being different from that along the surface of said substrate, said strip being placed in one of said first and second transmission lines between one of said reflectors and said second converter.

12. A surface acoustic wave filter as claimed in claim 10 or 11, wherein said strip is made of a conductive material, and wherein said substrate is made of a piezoelectric material.

* * * * *